United States Patent
Traynor et al.

Patent Number: 5,502,406
Date of Patent: Mar. 26, 1996

[54] LOW POWER LEVEL SHIFT CIRCUIT AND METHOD THEREFOR

[75] Inventors: Kevin M. Traynor; Hengwei Hsu, both of Austin, Tex.

[73] Assignee: Motorola, Inc., Schaumburg, Ill.

[21] Appl. No.: 399,004

[22] Filed: Mar. 6, 1995

[51] Int. Cl.$^6$ ............................................. H03R 19/0175
[52] U.S. Cl. .................................. 326/68; 326/33; 326/81
[58] Field of Search ................................ 326/33, 34, 62, 326/68, 80–81; 327/541, 312

[56] References Cited

U.S. PATENT DOCUMENTS

| | | | |
|---|---|---|---|
| 4,472,647 | 9/1984 | Allgood et al. | 326/71 X |
| 4,647,840 | 3/1987 | Hiyama | 323/315 |
| 4,767,946 | 8/1988 | Taylor | 307/264 |
| 4,980,583 | 12/1990 | Dietz | 326/68 |
| 4,988,898 | 1/1991 | Jansson . | |
| 5,045,730 | 9/1991 | Cooperman et al. | 326/73 |
| 5,144,165 | 9/1992 | Dhong et al. | 326/68 X |
| 5,148,118 | 9/1992 | Dobkin et al. | 330/252 |
| 5,202,855 | 4/1993 | Morton | 365/226 |
| 5,229,659 | 7/1993 | Sandhu | 326/33 X |
| 5,317,214 | 5/1994 | Lewis | 326/73 |
| 5,426,334 | 6/1995 | Skovmand | 327/536 X |
| 5,440,258 | 8/1995 | Galbi et al. | 327/541 X |

*Primary Examiner*—David R. Hudspeth
*Attorney, Agent, or Firm*—Elizabeth A. Apperley

[57] ABSTRACT

A low power level shift and buffer circuit (40) is used to level shift and amplify an output of an oscillator (14, 16, 18, 20, 22, 24) in a data processing application (10). A current mirror (58) and a reference current are used to provide a constant current source load for an inverter (56, 42). Separate controls for each of the two transistors forming a push/pull inverter (54, 50) eliminate a switching transient current by providing non-overlapping inputs to each of the two transistors. By eliminating the switching transient current, little power is consumed during the level shifting and amplification process. Furthermore, a significant amount of circuit area is not required and an output with fast rise and fall times is provided.

17 Claims, 3 Drawing Sheets

LOW POWER LEVEL SHIFT CIRCUIT AND METHOD THEREFOR

FIELD OF THE INVENTION

This invention relates generally to a shifter and buffer circuit, and more particularly to a low power shifter and buffer circuit using a current reference.

BACKGROUND OF THE INVENTION

Crystal oscillators are often used to provide a clock signal in a data processing application. When such crystal oscillators are used in a real time clock application, lithium batteries are the most common source of power. Furthermore, lithium batteries have a life span of many years when the attached oscillator dissipates only a minimal amount of power. For the battery to have a maximum life expectancy, the current drawn by the oscillator must be low and typically does not exceed one micro-amp during operation. Therefore, several circuits and methodologies have been developed to reduce the power consumed by the oscillator during operation.

The power consumed by a crystal oscillator may be minimized by recognizing that the oscillator may provide the clock signal during a weak-inversion (sub-threshold) operation. During such operation, the oscillator provides a clock signal which has only a small output amplitude that is less than a transistor threshold level. The use of the clock signal with a small output amplitude provides lower power consumption, but also requires a significant amount of time to transition between logic levels. Additionally, a level shift and buffer circuit must then be added to raise the amplitude to a predetermined level and to decrease the time required to transition between logic levels. The level shift and buffer circuit can consume a significant amount of power which outweighs any power savings due to the design of this type of oscillator. Therefore, while modification of the oscillator is one method for reducing the power consumption of oscillators in data processing application, the modification does not significantly reduce the power consumption of the circuit in general due to the level shift and buffer circuit. In light of this observation, it is often necessary for the power consumption of the level shift and buffer circuit to be optimized such that the total power consumption of both the oscillator and the level shift and buffer circuit is minimized.

FIG. 1 illustrates a first prior art implementation of a first level shift and buffer circuit 10 which provides a traditional level and shift buffer circuit. First level shift and buffer circuit 10 includes two inverters 12 and 14 which are coupled via a resistor labeled "R1." Additionally, a capacitor labeled "C1" is coupled between an input signal, "Vin," and the input to inverter 14. During operation, inverter 12 establishes a DC voltage bias point. Inverter 14 amplifies the oscillator signal provided by the Vin signal. Resistor R1 and capacitor C1 form a high pass filter which allows high frequency components of the Vin signal to be amplified by inverter 12. Inverters 12 and 14 are matched so that they switch (or invert) at a same logic level.

First level shift and buffer circuit 10 consumes a significant amount of power due to a bias current drawn by inverter 12 and requires a large amount of circuit area to construct capacitor C1 and resistor R1. In an industry in which devices are required to be smaller and consume less circuit area, the presence of a large capacitor and resistor are often prohibitive in a circuit. If the sizes of the capacitor and resistor are made smaller during manufacturing, the magnitude of the Vin signal must become larger for proper operation of the circuit. Therefore, a designer must compromise either the power consumption associated with providing the Vin signal with a large magnitude or the overhead associated with consumption of surface area on a semiconductor device.

A second level shift and buffer circuit 20, commonly referred to as a Schmidtt Trigger, is illustrated in FIG. 2. FIG. 2 includes three transistors, M3, M4, and M5, as an input stage. Transistors M1 and M2 form a current mirror which allows transistor M2 to mirror the reference current, Iref, to an input stage portion of circuit 20. When in the current mirror configuration, transistor M2 effectively provides a constant current source load for the inverter formed by transistors M2, M3, M4 and M5.

When the Vin signal is logic low (zero) level, transistor M2 pulls node N1 to a logic high (one) level and the output of the Vout signal is driven to a logic low (zero) level by an inverter formed by transistors M8 and M9. As the Vin signal transitions from a logic zero to a logic one value, transistor M3 begins to conduct current and pulls node N1 toward to the reference ground voltage. As node N1 reaches a switch point of the inverter formed by transistors M8 and M9, the voltage of the Vout signal rises from a ground reference voltage. When the Vout signal exceeds a threshold voltage of transistor M4, transistor M4 begins to conduct current thereby allowing transistors M4 and M5 to assist transistor M3 in pulling node N1 to the reference ground voltage. This feedback path results in a quick transition once the Vin signal reaches a rising edge switch point. The voltage of the Vin signal when the Vout signal is rapidly switched to a logic high value is a rising edge switch point of the Schmidtt trigger.

As the voltage of the Vin signal begins to decrease, there is little effect at the Vout signal until the voltage of the Vin signal nears the falling edge switchpoint of the inverter formed by transistors M2, M3, M4, and M5. As transistors M3 and M5 begin to turn off, node N1 will begin to rise and the voltage of the Vout signal will begin to fall. When the Vout signal begins to fall, transistor M4 begins to not conduct and a conduction path between transistors M4 and M5 is effectively turned off. This feedback path allows node N1 to rise even faster and the voltage of the Vout signal transitions to a logic low value very quickly. The voltage of the Vin signal where the Vout signal rapidly switches to a logic low value is the falling edge switch point of the Schmidtt trigger. A good Schmidtt trigger will have a rising edge switch point which is significantly higher than the falling edge switch point. In a standard inverter or buffer, the rising edge and falling edge switch points are typically the same voltage.

The level shift and buffer circuit of FIG. 2 consumes a high amount of power, however, due to a high switching transient current in each of the transistors, M2, M3, M4, M5, M8, and M9. Transistors M8 and M9 especially consume a significant amount of power. When compared with the level shift and buffer circuit of FIG. 1, the level shift and buffer circuit of FIG. 2 requires less circuit area, but still consumes excess power. Therefore, a need exists for a level shift and buffer circuit which consumes lower power while requiring less circuit area.

SUMMARY OF THE INVENTION

The previously mentioned needs are fulfilled with the present invention. Accordingly, there is provided, in a first form, a level shift circuit. The level shift circuit includes a circuit for generating a constant voltage reference value and a first inverter. The first inverter has a constant current source load and has an input for receiving an input signal and an output. The level shift circuit includes a circuit for generating a control signal in response to the constant voltage reference value. A second inverter has a first input coupled to the circuit for generating the control signal and a second input coupled to the first inverter for receiving the output of the first inverter. The second inverter provides a voltage output signal at a first logic level when the output of the first inverter is in a first logic state and the control signal is in a second logic state. The second inverter provides the voltage output signal at a second logic level when the output of the first inverter is in a third logic state and the control signal is in a fourth logic state.

Additionally, there is provided in a second form, a method for level shifting and buffering an input signal. The method includes the steps of generating a constant reference voltage value, receiving a voltage input signal, and inverting the voltage input signal using a first inverter having a constant current source load. The first inverter provides an inverted signal. The method also includes the steps of enabling a transfer circuit to provide a first control signal to a first portion of a second inverter in response to the constant reference voltage value and enabling the transfer circuit to provide a second control signal to a second portion of the second inverter in response to the constant reference voltage value, wherein the first control signal and the second control signal being non-overlapping. Furthermore, the method includes the step of enabling a second inverter to provide a voltage output signal at a first logic level when the first control signal is in a first logic state and to provide the voltage output signal at a second logic level when the second control signal is in a second logic state.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

The present invention provides a low power level shift and buffer circuit which has very low power consumption, does not require a significant amount of circuit area, and is able to provide an output with fast rise and fall times. These qualities of low power consumption, area efficiency, and speed are especially important in the present marketplace where portable applications in both computing and cellular applications are proliferating.

The present invention is typically used to level shift and amplify an output of an oscillator in a data processing application. A current mirror and a reference current are used to provide a constant current source load for an inverter. Separate controls for each of the two transistors forming a push/pull inverter eliminate a switching transient current by providing non-overlapping inputs to each of the two transistors. By eliminating the switching transient current, little power is consumed during the level shifting and amplification process performed by the low power level shift and buffer of the present invention. The present invention will now be described in greater detail.

Figure 1:
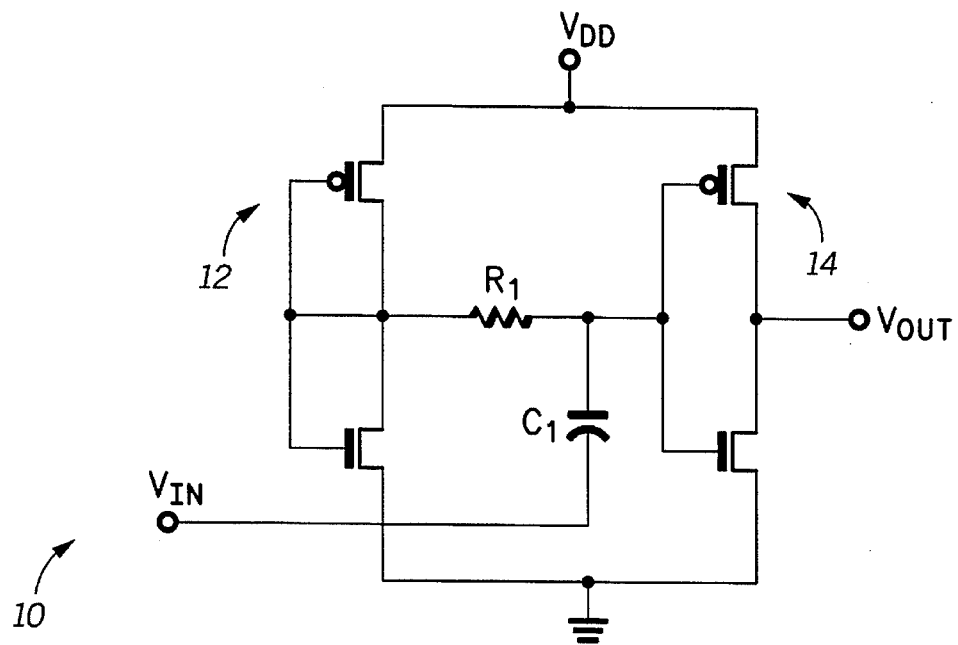
FIG. 1 illustrates in circuit diagram form a first prior art level shift and buffer circuit.
Figure 2:
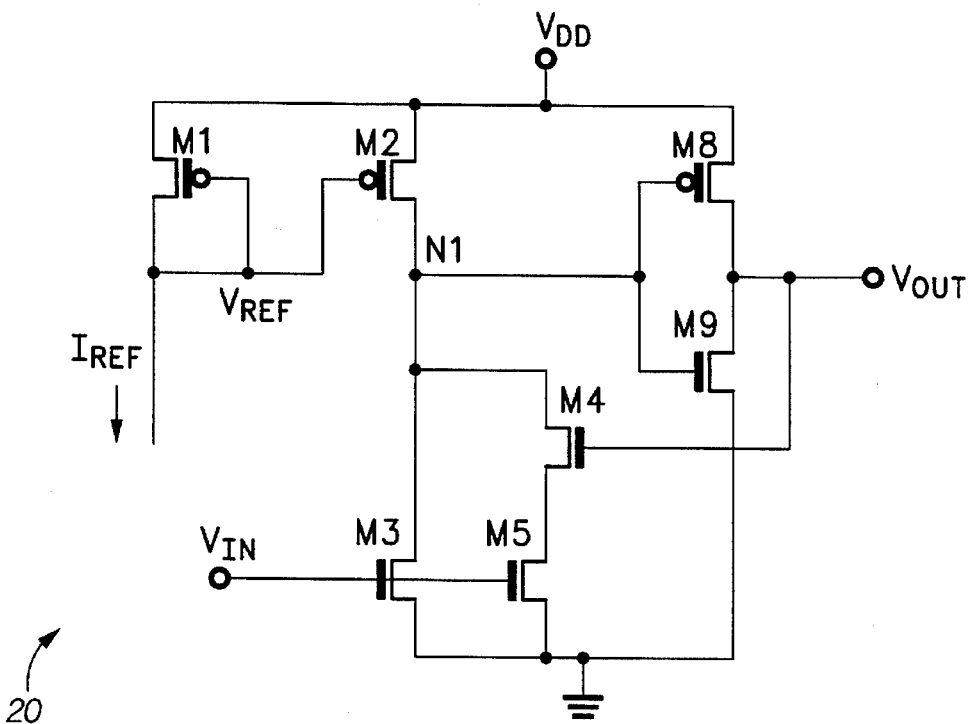
FIG. 2 illustrates in circuit diagram form a second prior art level shift and buffer circuit.
Figure 3:
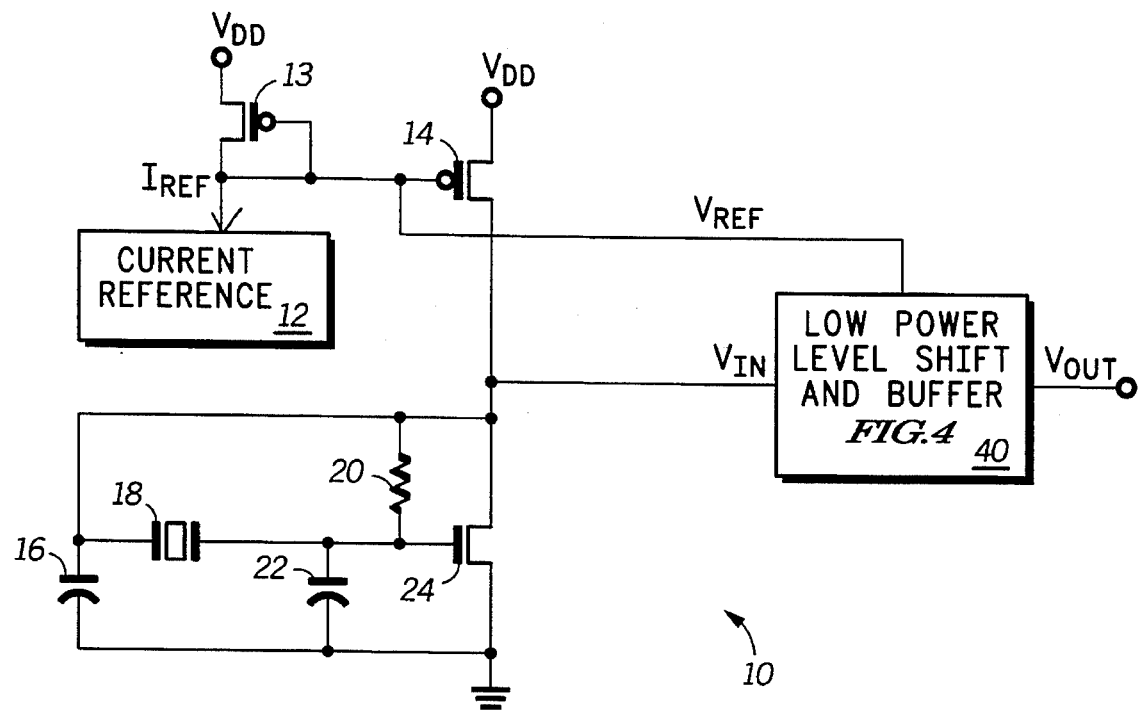
FIG. 3 illustrates in partial block diagram form an oscillator application in accordance with the present invention.

FIG. 3 illustrates an oscillator application 10 which includes the present invention. Oscillator application 10 includes a current reference 12, a transistor 13, a transistor 14, a capacitor 16, a crystal 18, a resistor 20, a capacitor 22, a transistor 24, and a low power level shift and buffer circuit 40. Current reference 12 includes an output which is coupled to low power level shift and buffer circuit 40 to provide a Vref signal. A first transfer electrode of transistor 13 is coupled to a supply voltage, Vdd, and a control electrode of transistor 13 is coupled to a second transfer electrode of transistor 13. The second transfer electrode of transistor 13 is also coupled to current reference 12 to provide a reference current signal labeled "Iref." The second transfer electrode of transistor 13 is coupled to a control electrode of transistor 14. A first transfer electrode of transistor 14 is coupled to the supply voltage, Vdd. A second transfer electrode of transistor 14 is coupled to a first transfer electrode of transistor 24. The first transfer electrode of transistor 24 is coupled to low power level shift and buffer circuit 40 to provide a Vin signal. A second transfer electrode of transistor 24 is coupled to a reference ground voltage. The first transfer electrode of transistor 24 is coupled to a first terminal of resistor 20, a first terminal of crystal 18, and a first terminal of capacitor 16. A second terminal of crystal 18 is coupled to a first terminal of capacitor 22, a second terminal of resistor 20, and a gate electrode of transistor 24. A second terminal of capacitor 16 is coupled to a second terminal of capacitor 22, and the reference ground voltage. Low power level shift and buffer circuit 40 provides a Vout signal. Note that transistor 13 and transistor 14 is a p-type transistor and transistor 24 is an n-type transistor in this embodiment of the invention.

Figure 4:
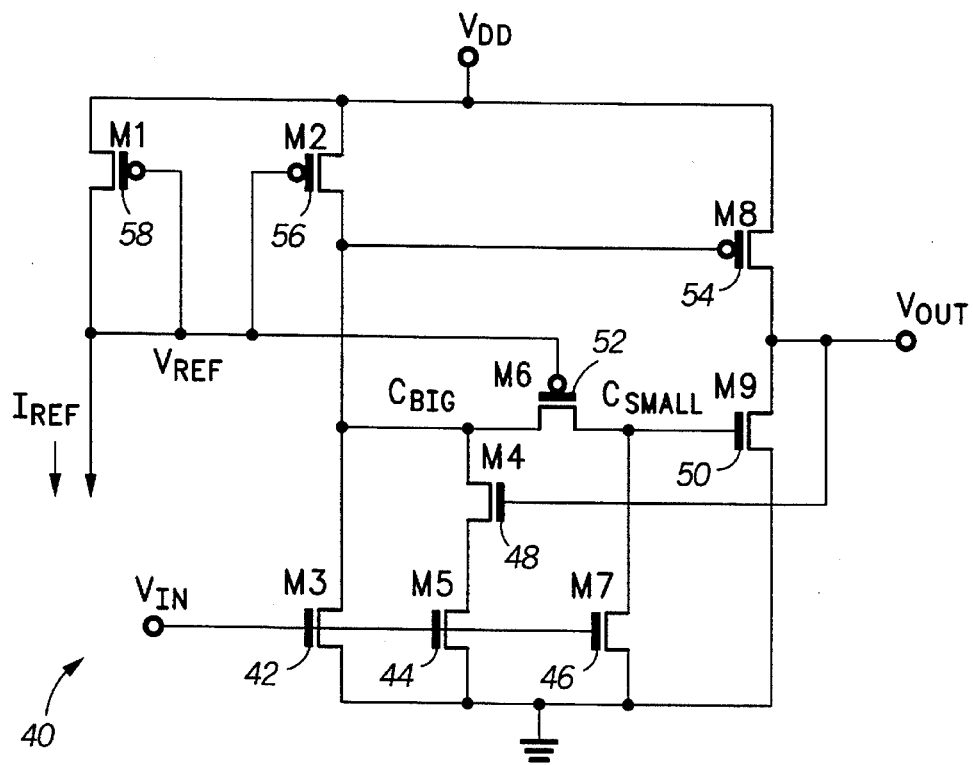
FIG. 4 illustrates a low power level shift and buffer circuit of the oscillator application of FIG. 3.

FIG. 4 illustrates low power level shift and buffer circuit 40 in greater detail. Level shift and buffer circuit 40 includes a transistor 42, a transistor 44, a transistor 46, a transistor 48, a transistor 50, a transistor 52, a transistor 54, a transistor 56, and a transistor 58. Note, transistor 58 is the same as transistor 13 of FIG. 3 and is included to aid description of operation of the device illustrated in FIG. 4. The Vin signal is provided to a gate electrode of each of transistors 42, 44, and 46. A first transfer electrode of each of transistors 42, 44, 46, and 50 is coupled to the reference ground voltage. A second transfer electrode of transistor 42 is coupled to a first transfer electrode of each of transistors 48 and 52, a second transfer electrode of transistor 56, and a gate electrode of transistor 54. A second transfer electrode of transistor 48 is coupled to a second transfer electrode of transfer 44. A gate electrode of transistor 48 is coupled to the Vout signal. A second transfer electrode of transistor 46 is coupled to a second transfer electrode of transistor 52 and to a gate electrode of transistor 50. A gate electrode of transistor 52 is coupled to a gate electrode of transistor 56, a gate electrode of transistor 58, and a first transfer electrode of transistor 58. A second transfer electrode of transistor 58, a first transfer electrode of transistor 56, and a first transfer electrode of transistor 54 are coupled to the supply voltage Vdd. A second transfer electrode of transistor 54 is coupled to a second transfer electrode of transistor 50 to provide the Vout signal. Nodal capacitances, respectively referred to as Cbig and Csmall, are indicated at appropriate locations illustrated in FIG. 4. Note that transistors 52, 54, 56, and 58 are p-type transistors and transistors 42, 44, 46, 48, and 50 are n-type transistors in this embodiment of the invention.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state.

General Description of Operation

FIG. 3 illustrates one embodiment of an application in which the present invention may be implemented. Crystal 18, capacitors 16 and 22, resistor 20, transistor 24, and transistor 14 function together to form an oscillator which provides a clock signal via the Vin signal. Design and operation of such an oscillator is well known in the data processing art and will not be described in detail herein. Current reference 12 is coupled to the oscillator by node Vref for creating a constant current source load for the oscillator.

Current reference 12 and transistor 13 of FIG. 3 form a current mirror by creating the fixed voltage, Vref. With the fixed voltage, Vref, the current Iref flowing in current reference 12 is mirrored in transistors 14 of FIG. 3 and 56 of FIG. 4. The current in each of the transistors 14 and 56 can be scaled by varying their respective device sizes, but the current will generally be proportional to the reference current, Iref. Transistor 14 provides a constant current source load for the oscillator formed by transistor 24, crystal 18, capacitors 16 and 22, and resistor 20. Transistor 56 of FIG. 4 provides a constant current source load for the inverter formed by transistors 42, 44, and 48.

To decrease power consumption, the clock signal provided by the oscillator has a low amplitude. Therefore, before being used with other logic circuitry, the clock signal must be level shifted and amplified using low power level shift and buffer circuit 40. Low power level shift and buffer circuit 40 level shifts and amplifies the Vin signal to provide a useful clock signal using a circuit design which consumes a minimal amount of power and allows for variations during the manufacturing process.

Low power level shift and buffer circuit 40 is illustrated in greater detail in FIG. 4. During operation, transistor 58 provides a reference current, Iref. Transistor 56 mirrors the current drawn by transistor 58 and pulls a current proportional to Iref. Transistor 42 is enabled to function in an inverter configuration which is biased by the current drawn by transistor 56. Since the amplitude of the Vin signal is small (typically between 0 V and 0.9 V), transistor 42 operates in a weak inversion region and is sized accordingly. Transistor 56 acts as a constant current source load and limits the current available to flow in transistor 42. Because of the limited available current, transistor 42 is biased into the weak inversion region. By limiting the current flow and the bias of transistor 42, power consumption is also limited. Note that transistor 42 is sized to be able to sink the current provided by transistor 56 and the current associated with discharging the nodal capacitance, $C_{big}$.

A push/pull inverter following transistor 42 includes transistor 50 and transistor 54. Separate non-overlapping control signals selectively enable and disable transistors 50 and 54 to transfer current. Because the control signals are non-overlapping, a switching current typically generated during operation of the inverter is eliminated and the power consumed by low power level shift and buffer circuit 40 is lowered. Transistor 52 and transistor 46 function together to provide the non-overlapping control signals to transistor 50 and transistor 54. Transistor 52 isolates nodes $C_{big}$ and $C_{small}$ from one another to allow nodes $C_{big}$ and $C_{small}$ to be charged and discharged at different rates. The different charge and discharge rates allow the invention to provide non-overlapping control signals to the inverter formed by transistors 50 and 54. The nodal capacitance, $C_{big}$, has a larger capacitance than the nodal capacitance indicated by $C_{small}$ due to larger drain and gate areas of transistors 56, 42, 48, and 54.

Figure 5:
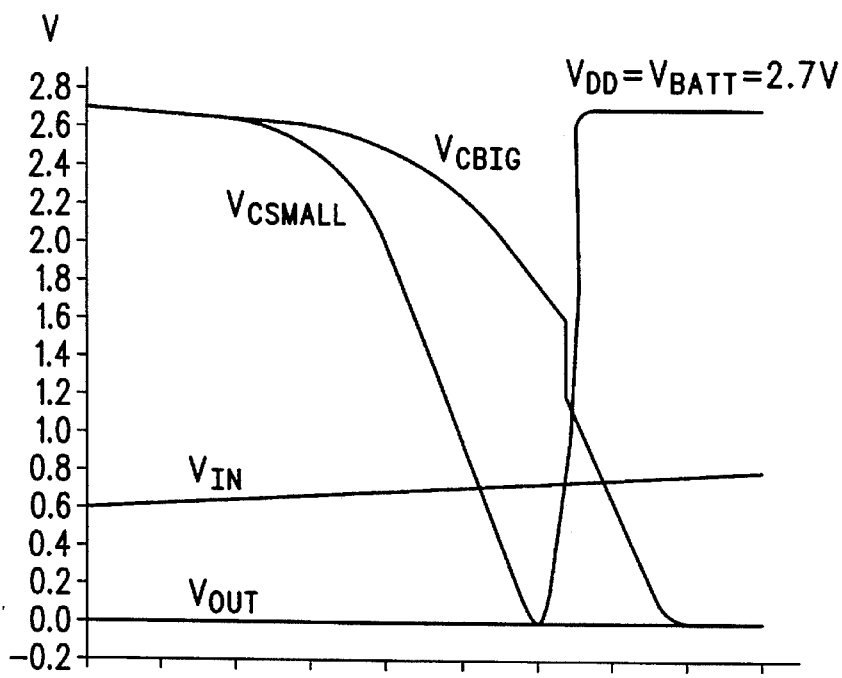
FIG. 5 illustrates in graphical form a first switching characteristic of the low power level shift and buffer circuit.

When the Vin signal rises, a current drawn by each of transistors 42 and 46 increases exponentially due to sub-threshold conduction. When the Vin signal first begins to transition, the nodal capacitance, $C_{big}$, is at a same potential voltage as the nodal capacitance, $C_{small}$. Because $C_{big}$ is significantly larger than $C_{small}$, transistor 42 must discharge a larger capacitance than transistor 46. In addition to discharging the larger capacitance, transistor 42 is required to sink the current drawn by the current mirror formed by transistor 56. If transistors 42 and 46 have a same shape factor (width/length), the nodal capacitance $C_{small}$ will discharge faster than $C_{big}$. Therefore, a voltage on a gate electrode of transistor 50 will be at a logic low value and transistor 50 will be non-conductive before the voltage at the discharged by $C_{big}$ reaches a transition point at which transistor 54 begins to be conductive. This results in non-overlapping inputs to each of transistors 50 and 54 forming the inverter and, therefore, in a significantly lower switching transient current between transistors 50 and 54. Note that the transition point at which transistor 54 begins to be conductive is equal to Vdd–Vtp, where Vdd is a supply voltage and Vtp indicates a threshold voltage of transistor 54. As the output voltage, Vout, approaches n-channel threshold value, Vtn, current begins to flow through transistors 48 and 44. After $C_{small}$ discharges and transistor 50 is no longer conductive, the discharge of $C_{big}$ toward a reference ground voltage is accelerated and hysteresis effect is provided. For a pictorial summary of the operation described, refer to FIG. 5.

Figure 6:
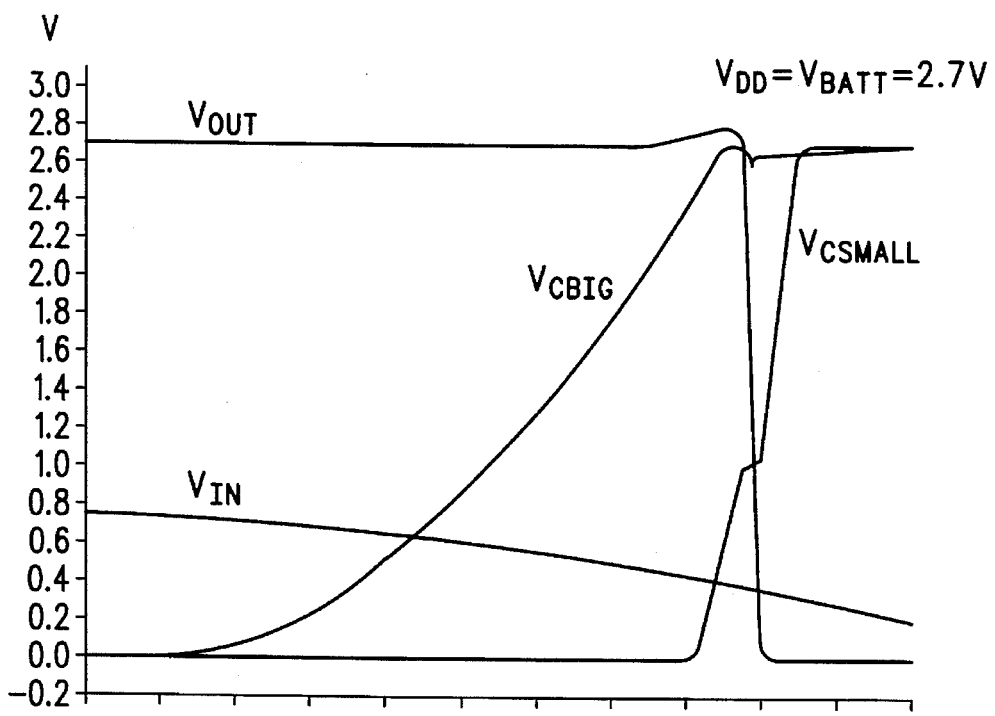
FIG. 6 illustrates in graphical form a second switching characteristic of the low power level shift and buffer circuit.

FIG. 6 provides a graphical illustration of the relationship between Vin, Vout, $C_{big}$, and $C_{small}$ in an operation in which Vin indicates a falling edge of an oscillator signal. On the falling edge of the Vin signal, the current drawn by transistors 42 and 46 decreases exponentially. The voltage of nodal capacitor $C_{big}$ gradually rises by current charging through transistor 56. Conductivity of transistor 54 is extinguished before the voltage of nodal capacitor $C_{big}$ reaches a value of Vref+Vtp, where Vref is a reference voltage provided by the current mirror and Vtp is a threshold voltage of transistor 52. When the voltage on nodal capacitor $C_{big}$ reaches the value Vref+Vtp, transistor 52 begins to conduct current. The voltage of nodal capacitor $C_{small}$ rises in response to the current charging of transistor 52. Because the capacitance of $C_{big}$ is much larger than the capacitance of Csmall, a charge transfer occurs and the voltage of Csmall quickly rises. This results in fast switching, low currents, and an overall low power consumption.

The isolation of the nodal capacitances $C_{big}$ and $C_{small}$ by transistor 52 allow the low power level shift and buffer circuit of the invention to provide non-overlapping inputs to each of transistors 54 and 50 of the inverter and allows low power level shift and buffer circuit 40 to perform a level shift and amplification function while consuming a minimal amount of power. Furthermore, the use of the current mirror formed by transistor 56 provides a way to compensate for variations during the manufacturing process. For instance, in a manufacturing process in which NMOS transistors (such as transistor 50) are strong and current reference 12 is built from NMOS transistors, the reference voltage, Vref is pulled to a lower voltage value. Therefore, transistor 56 is made more conductive in order to maintain a ratio of the resistance of each of the NMOS and PMOS devices. Additionally, a high threshold voltage for PMOS transistors (such as transistor 52) is compensated for by a lower gate voltage (Vref). Thus, the trigger voltage, Vref+Vtp at which Cbig and Csmall become connected by transistor 52 is less sensitive to process variations.

In summary, the present invention provides a low power level shift and buffer circuit which level shifts and amplifies a low level oscillator signal such that it may be used by subsequent logic circuitry. The use of nodal capacitors and a current mirror technique enable the present invention to be relatively immune to process variations and to provide a reliable output using a minimal amount of circuit area.

The implementation of the invention described herein is provided by way of example only. However, many other implementations may exist for executing the function described herein. For example, the present invention may be used in other circuits that operate in sub-threshold regions of transistor operation and need to interface with circuits operating at standard logic levels. Additionally, this invention may be used with any circuit that has a slowly transitioning output which should be converted to a signal with fast transition times. In an alternate implementation, the present invention need not be implemented using the current mirror current source load for the inverter formed by transistors 56 and 42. This inverter could be implemented as a conventional inverter. Furthermore, this invention could be implemented in bipolar or mixed BiCMOS technologies.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A level shift circuit, comprising:

means for generating a constant voltage reference value;

a first inverter having a constant current source load, the first inverter having an input for receiving an input signal and an output;

means for generating a control signal in response to the constant voltage reference value; and a second inverter having a first input coupled to the means for generating the control signal and a second input coupled to the first inverter for receiving the output of the first inverter, the second inverter providing a voltage output signal at a first logic level when the output of the first inverter is in a first logic state and the control signal is in a second logic state, the second inverter providing the voltage output signal at a second logic level when the output of the first inverter is in a third logic state and the control signal is in a fourth logic state.

2. The level shift circuit of claim 1 wherein the first inverter is comprised of:

a first transistor having a first electrode coupled to the input signal, a second electrode coupled a reference ground voltage value, and a third electrode; and a second transistor having a first electrode coupled to the constant reference voltage value, a second electrode coupled to the third electrode of the first transistor, and a third electrode coupled to a reference power voltage value.

3. The level shift circuit of claim 2 wherein the second transistor forms the constant current source load of the first inverter.

4. The level shift circuit of claim 2 wherein the means for generating the control signal comprises:

a third transistor having a first electrode coupled to the constant reference voltage value, a second electrode coupled to the third electrode of the first transistor, and a third electrode coupled to the second inverter for providing the control signal; and a fourth transistor having a first electrode coupled to the input signal, a second electrode coupled to the reference ground voltage value, and a third electrode coupled to the second inverter for providing the control signal.

5. The level shift circuit of claim 1 further comprising:

feedback means for transferring the voltage output signal to the first inverter, the voltage output signal enabling the first inverter to rapidly complete an inversion operation.

6. The level shift circuit of claim 1 further comprising a current mirror circuit for providing the constant voltage reference value.

7. A level shift circuit, comprising:

a first transistor having a first electrode, a second electrode coupled to the first electrode of the first transistor, and a third electrode coupled to a reference power voltage value;

a second transistor having a first electrode, a second electrode coupled to the first electrode of the first transistor, and a third electrode coupled to the reference power voltage value;

a third transistor having a first electrode for receiving a voltage input signal, a second electrode coupled to the first electrode of the second transistor, and a third electrode coupled to a reference ground voltage value;

a fourth transistor having a first electrode for receiving the voltage input signal, a second electrode, and a third electrode coupled to the reference ground voltage value;

a fifth transistor having a first electrode coupled to the first electrode of the first transistor, a second electrode coupled to the first electrode of the second transistor, and a third electrode coupled to the second electrode of the fourth transistor;

a sixth transistor having a first electrode coupled to the reference power voltage value, a second electrode coupled to the first electrode of the second transistor, and a third electrode for providing a voltage output signal; and a seventh transistor having a first electrode coupled to the third electrode of the sixth transistor, a second electrode coupled to the third electrode of the fifth transistor, and a third electrode coupled to the reference ground voltage value.

8. The level shift circuit of claim 7 further comprising:

an eighth transistor having a first electrode coupled to the reference ground voltage value, a second electrode for receiving voltage input signal, and a third electrode; and a ninth transistor having a first electrode coupled to the third electrode of the eighth transistor, a second electrode coupled to the first electrode of the seventh transistor, and a third electrode coupled to the second electrode of the fifth transistor.

9. The level shift circuit of claim 7 further comprising a current reference circuit for providing a constant current to the first electrode of the first transistor.

10. The level shift circuit of claim 7 further comprising an oscillator for providing the voltage input signal.

11. The level shift circuit of claim 7 wherein the voltage input signal is a small amplitude oscillator signal.

12. A method for level shifting and buffering an input signal, comprising the steps of:

generating a constant reference voltage value;

receiving a voltage input signal;

inverting the voltage input signal using a first inverter having a constant current source load, the first inverter providing an inverted signal;

enabling a transfer circuit to provide a first control signal to a first portion of a second inverter in response to the constant reference voltage value;

providing the inverted signal to a second portion of the second inverter, wherein the inverted signal and the first control signal are non-overlapping; and enabling a second inverter to provide a voltage output signal at a first logic level when the first control signal is in a first logic state and to provide the voltage output signal at a second logic level when the second control signal is in a second logic state.

13. The method of claim 12 wherein the constant current source load limits a current in the first transistor and limits power consumption of the first transistor.

14. The method of claim 12 wherein the transfer circuit is a first transistor and a second transistor, the first transistor being coupled between the first inverter and the second inverter and the second transistor being coupled between the first transistor and a reference ground voltage.

15. The method of claim 12 wherein the transfer circuit isolates a first node having a first nodal capacitance and a second node having a second nodal capacitance.

16. The method of claim 12 wherein the constant reference voltage signal is generated by a current mirror circuit.

17. The method of claim 12 further comprising the step of:

providing a feedback path between the second inverter and the first inverter.

* * * * *